United States Patent
Gershfeld

(10) Patent No.: US 6,449,164 B1
(45) Date of Patent: Sep. 10, 2002

(54) ENCLOSURE FOR HOUSING A PRINTED CIRCUIT BOARD

(76) Inventor: Jack Gershfeld, 615 Del Rio Way, Fullerton, CA (US) 92835

( * ) Notice: Subject to any disclaimer, the term of this patent is extended or adjusted under 35 U.S.C. 154(b) by 0 days.

(21) Appl. No.: 10/051,575

(22) Filed: Jan. 22, 2002

(51) Int. Cl.[7] .............................. H05K 5/02; H05K 1/18
(52) U.S. Cl. ..................... 361/752; 361/736; 439/74; 439/78; 174/50; 174/50.52; 174/65 R
(58) Field of Search ................... 361/752, 736; 174/50, 52.52, 50.53, 50.54, 55, 59, 65 R, 67; 439/74, 78

(56) References Cited

U.S. PATENT DOCUMENTS

| | | | | |
|---|---|---|---|---|
| 5,113,371 A | * | 5/1992 | Howe | 361/413 |
| 5,128,830 A | * | 7/1992 | DeLuca et al. | 361/383 |
| 5,260,854 A | * | 11/1993 | Hileman et al. | 361/736 |
| 5,883,785 A | * | 3/1999 | Rohrbeck et al. | 361/731 |
| 5,993,251 A | * | 11/1999 | Brown et al. | 439/540.1 |
| 6,351,374 B1 | * | 2/2002 | Sherry | 361/685 |

* cited by examiner

Primary Examiner—David Martin
Assistant Examiner—Dameon E. Levi
(74) Attorney, Agent, or Firm—Vladimir Khiterer

(57) ABSTRACT

An enclosure for housing a printed circuit board is disclosed. The enclosure comprises a shell with an open front and back, a front plate and back plate for attachment flush within, respectively, the open front and back. The front plate and back plate are secured to the shell by locking means. The printed circuit board housed within the enclosure is used as a structural element of the enclosure by rigid attachment to the front plate and back plate.

3 Claims, 2 Drawing Sheets

ENCLOSURE FOR HOUSING A PRINTED CIRCUIT BOARD

BACKGROUND OF THE INVENTION

This invention pertains to an enclosure for housing a printed circuit board. Many electronic devices comprise one printed circuit board enclosed in an enclosure. For example, small distribution amplifiers used in the audio visual industry often comprise one printed circuit board, two connectors attached to the printed circuit board and an enclosure housing the printed circuit board and connectors. Such electronic devices are often inexpensive, thus making the manufacture and assembly of the enclosure for the device a substantial part of the overhead to the manufacturer. Ideally, the enclosure must be durable and at the same time inexpensive to manufacture and simple to assemble.

SUMMARY OF THE INVENTION

The enclosure for housing a printed circuit board of the present invention is durable, inexpensive to manufacture and simple to assemble. The enclosure comprises a shell with an open front and back, a front plate and back plate for attachment flush within, respectively, the open front and back. The front plate and back plate are secured to the shell by locking means. Further, the printed circuit board housed within the enclosure is used as a structural element of the enclosure by rigid attachment to the front plate and back plate.

BRIEF DESCRIPTION OF THE DRAWINGS FIGURES

DETAILED DESCRIPTION OF THE PREFERRED EMBODIMENT

Figure 1:
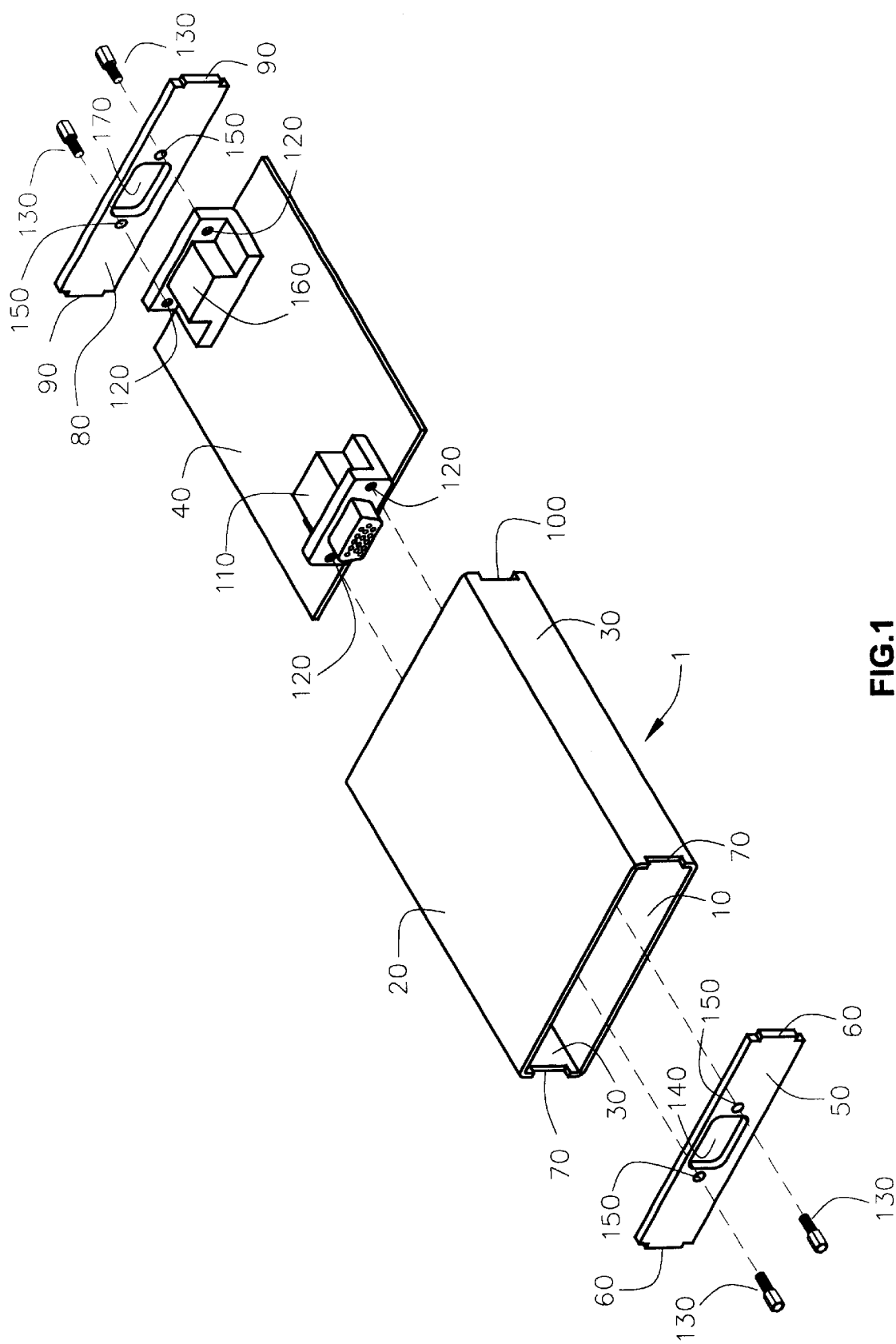
FIG. 1 shows exploded isometric view of the enclosure for housing a printed circuit board of the present invention.
Figure 2:
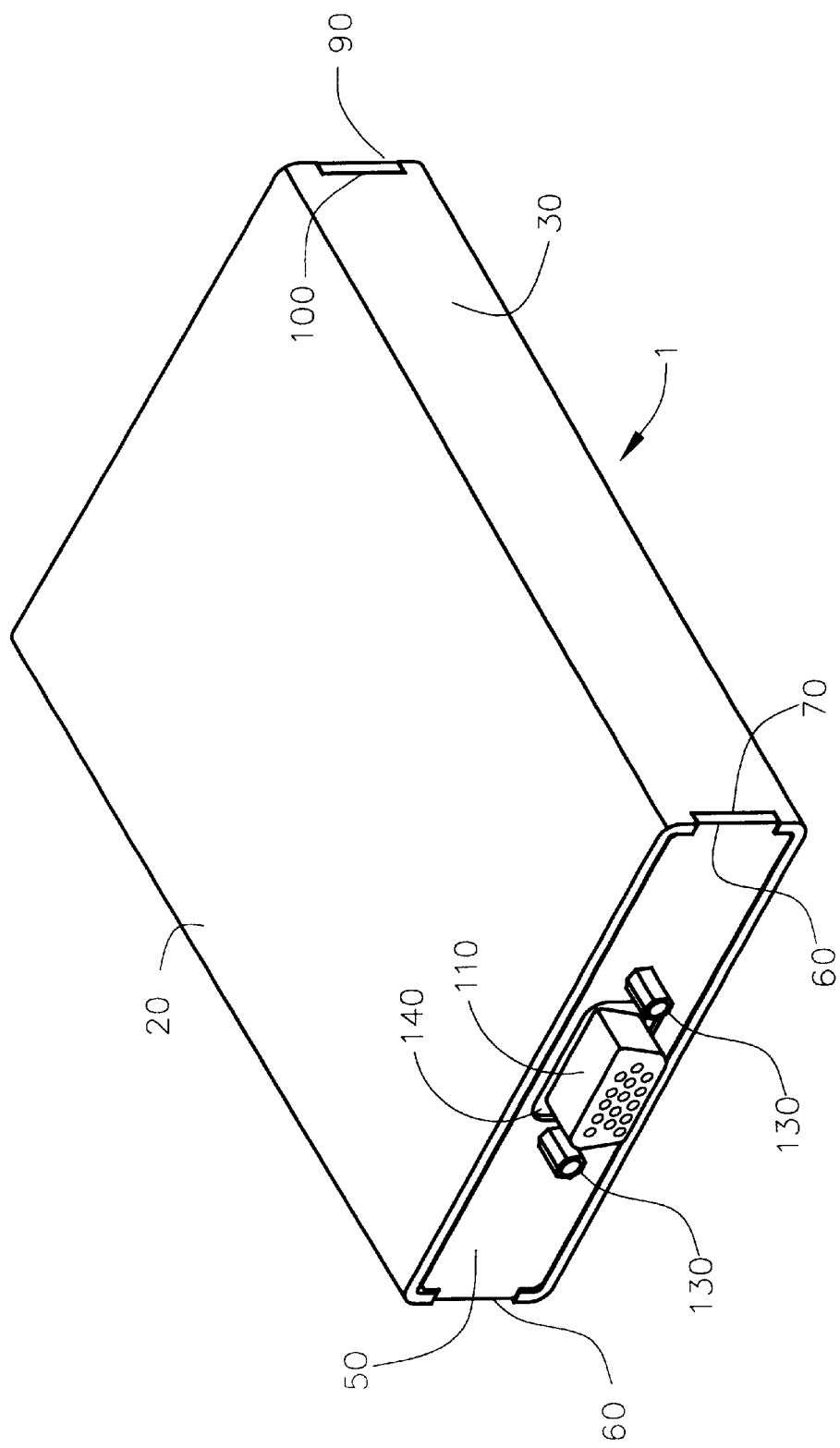
FIG. 2 shows isometric view of the enclosure for housing a printed circuit board of the present invention in the assembled condition.

This invention will be better understood with the reference to the drawing FIGS. FIG. 1 and FIG. 2. The same numerals refer to the same elements in all drawing figures.

Viewing FIG. 1, numeral 1 indicates a shell. Shell 1 comprises Floor 10, Ceiling 20 opposing Floor 10 and a pair of opposing Side Walls 30. Each Side Wall 30 has first, second, third and fourth ends, so that Floor 10 is connected to said fourth end, Ceiling 20 is connected to said second end. Further, viewing the left portion of FIG. 1, said first end of each of Side Wall 30, Floor 10 and Ceiling 20 define an open front. Similarly, said third end of each of Side Wall 30, Floor 10 and Ceiling 20 define an open back opposite to said open front.

Numeral 40 indicates a printed circuit board. Printed Circuit Board 40 has a front edge, back edge and a pair of opposing side edges. Shell 1 is suitable for housing Printed Circuit Board 40 in a way that the front edge of Printed Circuit Board 40 is adjacent to said open front, the back edge of Printed Circuit Board 40 is adjacent to said open back and the side edges of Printed Circuit Board 40 are adjacent to Side Walls 30.

Numeral 50 indicates a front plate. A Front Plate 50 is for attachment flush within said open front. Numeral 60 indicates front male locking means. Front Male Locking Means 60 are disposed on opposing edges of Front Plate 50 and are shown in FIG. 1 as rectangular protrusions outwardly extending from the opposing edges of Front Plate 50. Numeral 70 indicates front female locking means. Front Female Locking Means 70 are disposed in said first ends of Side Walls 30 for receiving Front Male Locking Means 60. Front Female Locking Means 70 are shown in FIG. 1 as rectangular notches.

Numeral 80 indicates a back plate. A Back Plate 80 is for attachment flush within said open back. Numeral 90 indicates back male locking means. Back Male Locking Means 90 are disposed on opposing edges of Back Plate 80 and are shown in FIG. 1 as rectangular protrusions outwardly extending from the opposing edges of Back Plate 80. Numeral 100 indicates back female locking means. Back Female Locking Means 100 are disposed in said third ends of Side Walls 30 for receiving Back Male 4 Locking Means 90. Back Female Locking Means 100 are shown in FIG. 1 as rectangular notches.

Numeral 110 indicates front securing means. Front Securing Means 110 is for rigidly attaching Front Plate 50 to Printed Circuit Board 40. Front Securing Means 110 is shown in FIG. 1 as a front connector suitable for connecting Printed Circuit Board 40 to interconnect cables, said front connector is affixed to the front edge of Printed Circuit Board 40. Numeral 120 indicates nuts. Numeral 130 indicates bolts. Numeral 140 indicates an opening for receiving said front connector. Numeral 150 indicates openings for receiving Bolts 130. Nuts 120 and Bolts 130 are for securing said front connector to Front Plate 50.

Numeral 160 indicates back securing means. Back Securing Means 160 is for rigidly attaching Back Plate 80 to Printed Circuit Board 40. Back Securing Means 160 is shown in FIG. 1 as a back connector suitable for connecting Printed Circuit Board 40 to interconnect cables, said back connector is affixed to the back edge of Printed Circuit Board 40. Numeral 120 indicates nuts. Numeral 130 indicates bolts. Numeral 170 indicates an opening for receiving said back connector. Numeral 150 indicates openings for receiving Bolts 130. Nuts 120 and Bolts 130 are for securing said back connector to Back Plate 80 in the same manner as securing said front connector to Front Plate 50.

Viewing now FIG. 2, Front Male Locking Means 60 are lockingly engaged, by the force of friction, with Front Female Locking Means 70. Further, Front Plate 50 is rigidly attached to Front Securing Means 110 by way of Bolts 130. Similarly, Back Male Locking Means 90 are lockingly engaged, by the force of friction, with Back Female Locking Means 100. Further, Back Plate 80 is rigidly attached to Back Securing Means 160 by way of Bolts 130. Therefore, Front Plate 50 is securely attached flush within said open front and Back Plate 80 is securely attached flush within said open back, while both Front Plate 50 and Back Plate 80 are rigidly attached to Printed Circuit Board 40, thus holding the structure together.

While the present invention has been described and defined by reference to the preferred embodiment of the invention, such reference does not imply a limitation on the invention, and no such limitation is to be inferred. The invention is capable of considerable modification, alteration, and equivalents in form and function, as will occur to those ordinarily skilled and knowledgeable in the pertinent arts. The depicted and described preferred embodiment of the invention is exemplary only, and is not exhaustive of the scope of the invention. Consequently, the invention is intended to be limited only by the spirit and scope of the appended claims, giving full cognizance to equivalents in all respects.

What is claimed is:

1. An enclosure for housing a printed circuit board comprising:
   (a) a shell comprising:
       a floor, a ceiling opposing said floor, a pair of opposing side walls each having first, second, third and fourth ends;
       said floor is connected to said fourth end of each of said side walls;
       said ceiling is connected to said second end of each of said side walls;
       said first end of each of said side walls, said floor and said ceiling define an open front;
       said third end of each of said side walls, said floor and said ceiling define an open back opposite to said open front;
   (b) a printed circuit board housed inside said shell, said printed circuit board comprising a front edge, a back edge and a pair of opposing side edges in a way that the front edge is adjacent to said open front, the back edge is adjacent to said open back and the side edges are adjacent to said side walls;
   (c) a front plate for attachment flush within said open front, said front plate comprising a pair of front male locking means disposed on opposing edges of said front plate, said first ends of each of said side walls further comprising front female locking means for lockingly engaging with said front male locking means;
   (d) a back plate for attachment flush within said open back, said back plate comprising a pair of back male locking means disposed on opposing edges of said back plate, said third ends of each of said side walls further comprising back female locking means for lockingly engaging with said back male locking means;
   (e) a front securing means for rigidly attaching said front plate to the printed circuit board, said front securing means affixed to the front edge;
   (f) a back securing means for rigidly attaching said back plate to the printed circuit board, said back securing means affixed to the back edge.

2. An enclosure for housing a printed circuit board as in claim 1, wherein said front male locking means are rectangular protrusions outwardly extending from the opposing So edges of said front plate, said back male locking means are rectangular protrusions outwardly extending from the opposing edges of said back plate, said front female locking means and said back female locking means are rectangular notches, such that said rectangular protrusions lockingly engage with said rectangular notches by way of the force of friction.

3. An enclosure for housing a printed circuit board as in claim 2, wherein;
   (a) said front securing means further comprises a front connector suitable for connecting the printed circuit board to interconnect cables, said front connector comprising nuts and bolts for securing said front connector to said front plate;
   (b) said front plate further comprises an opening for receiving said front connector and openings for receiving said nuts and bolts;
   (c) said back securing means further comprises a back connector suitable for connecting the printed circuit board to interconnect cables, said back connector comprising nuts and bolts for securing said back connector to said back plate;
   (d) said back plate further comprises an opening for receiving said back connector and openings for receiving said nuts and bolts.

* * * * *